United States Patent [19]

Wilhelm

[11] 3,806,736

[45] Apr. 23, 1974

[54] TEMPERATURE COMPENSATED EMITTER COUPLED LOGIC CIRCUIT

[75] Inventor: Wilhelm Wilhelm, Munich, Germany

[73] Assignee: Siemens Aktiengesellschaft, Berlin and Munich, Germany

[22] Filed: July 18, 1972

[21] Appl. No.: 272,845

[30] Foreign Application Priority Data

Aug. 5, 1971 Germany ........................... 2139312

[52] U.S. Cl. ................. 307/215, 307/218, 307/297, 307/31 O, 330/23, 330/30 D

[51] Int. Cl. ........................................... H03k 19/08

[58] Field of Search ........... 307/310, 297, 215, 218; 330/23, 30 D

[56] References Cited

UNITED STATES PATENTS

| | | | |
|---|---|---|---|
| 3,579,272 | 5/1971 | Foss | 307/310 X |
| 3,622,199 | 11/1971 | Marley | 307/310 X |
| 3,679,917 | 7/1972 | Bryant et al. | 307/310 X |
| 3,636,384 | 1/1972 | Dewitt | 307/310 X |
| 3,716,722 | 2/1973 | Bryant et al. | 307/310 X |

*Primary Examiner*—Rudolph V. Rolinec
*Assistant Examiner*—William D. Larkins
*Attorney, Agent, or Firm*—Hill, Sherman, Meroni, Gross & Simpson

[57] ABSTRACT

A temperature compensated emitter coupled logic circuit includes a differential amplifier formed of a pair of emitter coupled transistors each having emitter follower stages connected to the respective outputs thereof. A compensation network is connected with the collectors of the transistors of the differential amplifier by way of separate decoupling resistors supplying or receiving, respectively, a current which is independent of the switching state of the differential amplifier and whose magnitude increases with increasing temperature.

2 Claims, 3 Drawing Figures

TEMPERATURE COMPENSATED EMITTER COUPLED LOGIC CIRCUIT

BACKGROUND OF THE INVENTION

1. Field of the Invention

This invention relates to an emitter coupled logic circuit including a differential amplifier formed of emitter coupled transistors and having emitter follower output stages.

2. Description of the Prior Art

The emitter coupled logix (ECL) circuits are most suited for the construction of fast logical circuits, due to their short delay time. The basic structure of such a circuit consists of a differential amplifier having two transistors whose emitters are connected with each other and jointly fed by a source of approximately constant current. The base of one of the transistors forms the control input; and the base of the other transistor is connected to a fixed auxiliary potential which is at least approximately equal to the arithmetic mean of the high and low control potentials. In order to form OR or OR/NOT functions, the collector-emitter paths of additional transistors of the same conductivity type, which are also controlled at the base, are connected in parallel with the collector-emitter path of the controlled transistor of, for example, an npn conductivity type. As is well known, AND linkages can be constructed with the help of such a gating circuit, even if inverted signals are applied to the input of the control transistors. In this connection see, for example, the magazine "Computer Design," December, 1962, pages 26–30.

The prior art emitter coupled logic circuit constructed in accordance with monolithic construction techniques has static transmission characteristics which comprise essential dispersions due to the tolerances and the temperature dependency of the component-element data. Due to these properties, a decrease in signal rise for improving the transit (delay) time loss product becomes a problem, although it is, in itself, desired. It is of particular importance, however, that the static interference safety thereby becomes so small that a safe operation is not possible over a fairly large temperature range. This interference behavior of the emitter coupled logic circuit is primarily caused by the temperature range, and by the dispersion of the base-emitter of the transistors of the output emitter follower stage.

The Fairchild data sheet of the Series 9500, volume 1970, sets forth a temperature-compensated emitter follower logic circuit in which the compensation occurs in such a way that the current source feeding the differential amplifier comprises a reverse acting temperature range with respect to the emitter follower. Therefore, the lower output level will be temperature compensated. The high output level is stabilized by the lower output level with the help of a series circuit constructed of two diodes connected in an anti-parallel relation and a resistor connecting the collectors of the oppositely connected transistors of the differential amplifier.

The drawback of this circuit arrangement resides in the fact that the compensation circuit participates in the switching process of the logic circuit and delays the switching operation due to the additionally required charge-reversing process. Of particular concern is the charge reversal of the barrier layer capacitances of the anti-parallel connected diodes at twice the level of the signal rise, and, with a monolithic construction, furthermore the charge reversal of the insulator capacitance of these diodes with respect to the substrate. It is true, that the signal rise of the prior art circuit arrangement can be lowered, and thus also the loss, but the product of loss and transit time cannot be decreased, or only decreased to a very limited degree, due to the transit time increase.

SUMMARY OF THE INVENTION

The present invention is based on the task of providing a temperature compensated emitter coupled logic circuit having output emitter followers, wherein compensation means are not concerned in the switching process, and do not, therefore, cause an increase of the signal transit time.

The foregoing task is solved, according to the present invention, by the provision of a compensation network which is connected with the collectors of the transistors of the differential amplifier by way of separate decoupling resistors, which supply or receive, respectively, a current which is independent of the switching state of the differential amplifier and whose magnitude increases with increasing temperature.

BRIEF DESCRIPTION OF THE DRAWING

Other objects, features and advantages of the invention, its organization, construction and operation will best be understood from the following detailed description of a preferred embodiment thereof taken in conjunction with the accompanying drawing, on which.

DESCRIPTION OF THE PREFERRED EMBODIMENTS

Figure 1:
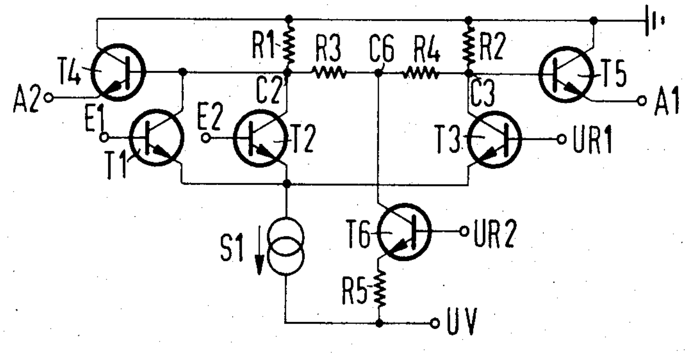
FIG. 1 is a schematic circuit diagram of an embodiment of the invention.

If first of all the resistors R3 through R5, and the transistor T6 are disregarded, the remaining portion of the circuit of FIG. 1 will represent a prior art OR-NOR circuit constructed in accordance with emitter coupled logic techniques, having a pair of inputs E1, E2 and a pair of outputs A1, A2. If the signals are denoted with the references of the terminals where they occur, the following holds true:

$$A1 = E1 + E2 \text{ and } A2 = \overline{E1 + E2}.$$

The two transistors T1 and T2, which are controlled by the input signals E1, E2, on the one hand, and the transistor T3 with its base connected to a fixed auxiliary potential UR1, form a differential amplifier, in connection with the collector resistors R1 and R2 and a constant current source S1. The output emitter followers include the respective transistors T4 and T5, as is well known in the art, and serve for adapting the levels of the output signals to the levels required for the input signals of the following stages, in addition to improving loading capacity. The potential UV represents a pole of the operational voltage source, which is negative in the sample embodiment, while the other, positive, pole is grounded and forms a reference potential.

In order to compensate the temperature direction of the voltage drops at the base-emitter paths of the transistors T4 and T5, the network is provided comprising the transistor T6 and the resistors R3 through R5 which have heretofore been excluded from this consideration. The emitter of the transistor T6 is connected with the potential UV of the operational voltage source, by way of the resistor R5; the base is connected to the fixed auxiliary potential UR2 which is adjusted in such a way that the transistor T6 carries a small current as compared with the current of the constant current source S1. The transistor T6 therefore forms a constant current source which, however, is only true in the strict sense of the definition, particularly with respect to the independence of the received current. In order to obtain the desired compensation effect, the collector current must be temperature 119 due to the transistor T6. This is also the case since the base-emitter voltage UBE of this transistor is also variable, along with the temperature, and thus the effective control voltage for the transistor changes.

Partial currents flow from the connection points C2 and C3 to the point C6, via the decoupling resistors R3 and R4, respectively, where they add to the current IK. In this manner, the values for the resistors R3 and R4 are to be as large as possible for a good decoupling of the points C2 and C3. However, these resistance values may not be too large, in order to prevent impairment of the effectiveness of the transistor T6 as a constant current source. Otherwise, the values of these resistors do not, influence the function of the compensation circuit. As opposed to this, the ratio between the resistance values of the collector resistors R1 and R2, respectively, and the emitter resistor R5 are of importance. An optimum compensating effect results when the value of the collector resistors R1 and R2, respectively, is twice the value of the emitter resistor R5.

Figure 2:
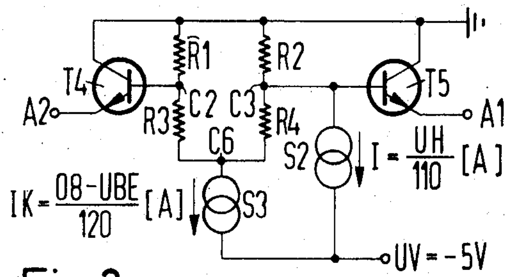
FIG. 2 is an equivalent circuit diagram for the arrangement according to FIG. 1, on the basis of a certain switching state.

In order to better undertand the function, an equivalent circuit diagram of the circuit arrangement according to FIG. 1 has been illustrated in FIG. 2. Simultaneously, FIG. 2 contains some relationship statements for dimensioning, as an example. The equivalent circuit diagram holds true for the case where the output A1 = 0, i.e., for the switching state whereby the terminal A1 carries the low signal level (logical 0). The constant current source S2 corresponds to the constant current source S1 in FIG. 1, since the conductively controlled transistor T3 does not change the conditions. For example, the current I = UH/110 [A], where UH is the signal rise, i.e., the difference between the high and low signal potentials.

The constant current source is formed by the transistor T6, in connection with the emitter resistor R5 and the fixed auxiliary potential UR2. The current, for example having the magnitude IK = (0.8 − UBE)/120 [A], will subdivide into the partial currents IK1 and IK2, and their effect causes different potentials to move further away from their reference potentials at the points C2 and C3 than would have been the case without their presence.

The movement of potential must be temperature dependent and of sufficient degree that it equalizes the change of the base-emitter voltage of the transistors T4 and T5, which is dependent on temperature. This effect is also obtained due to the temperature dependency of the current IK which, as mentioned above, depends on the base-emitter voltage UBE, which itself is variable with the temperature, for example according to the relation IK = (0.8 − UBE)/120 [A].

Figure 3:
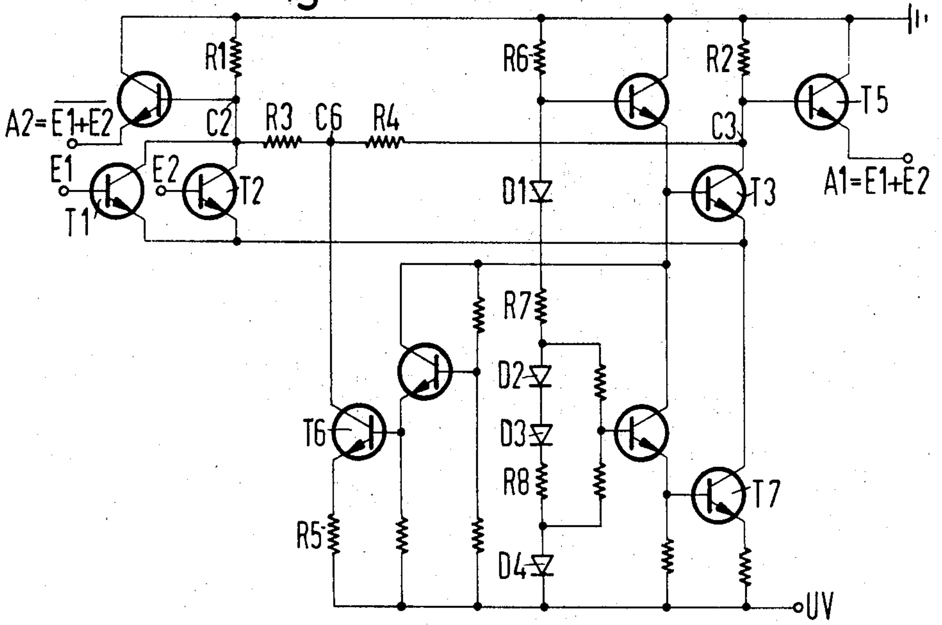
FIG. 3 is a further sample embodiment of the invention illustrated in schemati circuit diagram form.

FIG. 3 illustrates an emitter coupled logic circuit which, in addition to the circuit parts shown in FIG. 1, and which have the same reference characters, contains means for the production of the required auxiliary potentials which are well known in the art. It is worth particular mention that the respective network has been constructed in such a way that the base potentials for the transistors T3 and T6 are temperature independent, primarily due to the corresponding dimensioning of the voltage divider comprising a plurality of diodes D1 through D4 and the resistors R6 through R8, but the base potential for the transistor T6 (constant current source S1) depends on temperature in such a way that the collector current remains constant. The network for the production of the auxiliary potentials can generally be utilized by several circuits at the same time.

The potential at the collector point C6 (FIG. 1) of the compensation transistor T6 is independent of the switching state of the circuit, since opposite respective equal potential shifts will occur at points C2 and C3. An essential advantage of the compensation device according to the present invention results from this feature and resides in the fact that no additional capacitors must be recharged during the switching process, and thus no increase of the switching time or the signal transit time, respectively, occurs as compared with an uncompensated, but otherwise comparable, circuit.

Although I have described my invention by reference to particular illustrative embodiments thereof, many changes and modifications of my invention may become apparent to those skilled in the art without departing from the spirit and scope thereof. I therefore intend to include within the patent warranted hereon all such changes and modifications as may reasonably and properly be included within the scope of my contribution to the art.

I claim:

1. In a temperature compensated emitter coupled logic circuit of the type wherein a differential amplifier formed of emitter coupled transistors has emitter followers connected at its outputs, the improvement comprising a pair of decoupling resistors connected together, and a compensation network connected with the collectors of the transistors of the differential amplifier via separate ones of said decoupling resistors and carrying a current which is independent of the switching state of the differential amplifier, the magnitude of which current increases with increasing temperature, said compensation network comprising at least one transistor having a collector connected with the connection point of the two decoupling resistors, a base connected to a fixed potential and an emitter connected to a pole of an operational voltage source, and an emitter resistor connected between said emitter of said one transistor and the pole of the operational voltage source.

2. The improvement in an emitter coupled logic circuit according to claim 1, wherein the transistors of the differential amplifier each have a collector resistor, and the ratio of resistance between the collector resistors of the transistors of the differential amplifier and the emitter resistor of said one transistor in the compensation network is equal to 2.

* * * * *